(12) United States Patent
Ayel

(10) Patent No.: US 12,107,099 B2
(45) Date of Patent: Oct. 1, 2024

(54) COMPARATOR OF A VOLTAGE OF A SENSE NODE OF A PIXEL TO A COMPARISON VOLTAGE

(71) Applicant: Commissariat à l'Energie Atomique et aux Energies Alternatives, Paris (FR)

(72) Inventor: François Ayel, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 18/347,257

(22) Filed: Jul. 5, 2023

(65) Prior Publication Data

US 2024/0019300 A1    Jan. 18, 2024

(30) Foreign Application Priority Data

Jul. 15, 2022 (FR) ...................................... 2207272

(51) Int. Cl.
*H01L 27/146* (2006.01)
*G01J 1/44* (2006.01)
(Continued)

(52) U.S. Cl.
CPC .......... *H01L 27/14612* (2013.01); *G01J 1/44* (2013.01); *H01L 27/14609* (2013.01); *G01J 2001/446* (2013.01); *G01J 2001/448* (2013.01); *H01L 27/14634* (2013.01); *H04N 25/772* (2023.01); *H04N 25/78* (2023.01)

(58) Field of Classification Search
CPC ......... H01L 27/14612; H01L 27/14609; H01L 27/14634; G01J 1/44; G01J 2001/446; G01J 2001/448; H04N 25/78; H04N 25/772
See application file for complete search history.

(56) References Cited

U.S. PATENT DOCUMENTS 11,552,116 B2 *  1/2023  Dalleau ............. H01L 27/14612
2005/0219094 A1  10/2005  Murphy
(Continued)

FOREIGN PATENT DOCUMENTS

EP    3823165 A1    5/2021
EP    3876523 A1    9/2021

OTHER PUBLICATIONS

Chen, S. "Development of Event-based Sensor and Applications." In CVPR. 2021.

(Continued)

*Primary Examiner* — Jennifer D Bennett
(74) *Attorney, Agent, or Firm* — Jordan IP Law, LLC

(57) ABSTRACT

A light sensor (4) in which each of its pixels comprises: first and second MOS transistors (T1, T2) series-connected through their sources (S), a gate of the second transistor (T2) receiving a comparative voltage (Vcmp); a first current source (104) series-connected with said transistors (T1, T2) between a first supply voltage (GND) and a second supply voltage (VDD2); a third MOS transistor (T3) and a second current source (108) series-connected between a third supply voltage (GND) and a fourth supply voltage (VDD1), wherein the third transistor (T3) has a gate connected to a connection node (106) of the first current source (104) to the first and second transistors (T1, T2); a photodiode (PD) coupled to a gate of the first transistor (T1); and a switch (RST) connected to the gate of the first transistor (T1).

14 Claims, 2 Drawing Sheets

(51) Int. Cl.
    *H04N 25/772*     (2023.01)
    *H04N 25/78*     (2023.01)

(56) References Cited

U.S. PATENT DOCUMENTS

| | | | | |
|---|---|---|---|---|
| 2019/0094394 | A1* | 3/2019 | Matsumoto | H04N 25/771 |
| 2020/0260043 | A1* | 8/2020 | Seo | H04N 25/772 |
| 2021/0281788 | A1* | 9/2021 | Bogaerts | H04N 25/79 |
| 2023/0108619 | A1* | 4/2023 | Hanzawa | H04N 25/47 |
| | | | | 348/301 |
| 2024/0056701 | A1* | 2/2024 | Kumata | H04N 25/77 |

OTHER PUBLICATIONS

Suh, Yunjae, Seungnam Choi, Masamichi Ito, Jeongseok Kim, Youngho Lee, Jongseok Seo, Heejae Jung et al. "A 1280× 960 dynamic vision sensor with a 4.95-μm pixel pitch and motion artifact minimization." In 2020 IEEE international symposium on circuits and systems (ISCAS), pp. 1-5. IEEE, 2020.

Finateu, Thomas, Atsumi Niwa, Daniel Matolin, Koya Tsuchimoto, Andrea Mascheroni, Etienne Reynaud, Pooria Mostafalu et al. "5.10 a 1280× 720 back-illuminated stacked temporal contrast event-based vision sensor with 4.86 μm pixels, 1.066 GEPS readout, programmable event-rate controller and compressive data-formatting pipeline." In 2020 IEEE International Solid-State Circuits Conference—(ISSCC), pp. 112-114. IEEE, 2020.

Preliminary Search Report for French Application No. 2207272 dated Feb. 24, 2023, 2 pages.

Bastida, E. M., V. Corso, C. A. Finardi, R. A. Fischer, and V. Patiri. "A design approach for mass producible high-bit-rate MMIC transimpedance amplifiers." IEEE microwave and guided wave letters 7, No. 10 (1997): 317-319.

\* cited by examiner

COMPARATOR OF A VOLTAGE OF A SENSE NODE OF A PIXEL TO A COMPARISON VOLTAGE

FIELD

The present disclosure relates generally to the field of light sensors, and more specifically relates to the pixels of those light sensors.

BACKGROUND

Light sensors comprising a plurality of pixels, for example as an array, are known in the art. In a pixel of a light sensor, an amount of light received by at least one photo-detector of the pixel during an integration stage of the light by the pixel defines a voltage of a sense node of the pixel. Then, reading the pixels means getting a signal representative of the value of the voltage of the sense node. This signal representative of the voltage of the sense node can then be compared to a comparative voltage to get a binary signal, whose binary state specifies whether this signal representative of the tension in the sense node is higher or lower than the comparative voltage. Getting the binary signal constitutes all or a part of an analogue-to-digital conversion.

A comparator is used to implement the comparison of the signal representative of the voltage of the sense node to the comparative voltage

SUMMARY

There is a need for a light sensor that compensates for all or a part of the drawbacks of known light sensors.

An embodiment compensates for all or a part of the drawbacks of known light sensors, for example of known pixels of these known sensors.

An embodiment provides, for example, a light sensor where each pixel comprises a comparator such as described below, wherein the pixel is more compact than pixels with integrated comparator in known light sensors.

An embodiment provides, for example, a light sensor where each pixel comprises a comparator such as described below, wherein the pixel has less dispersion than pixels with integrated comparator in known light sensors.

An embodiment provides, for example, a light sensor where each pixel comprises a comparator such as described below, wherein the pixel has less dispersion than pixels with integrated comparator in known light sensors.

An embodiment provides, for example, a light sensor implemented in a stack of semiconductor tiers or layers requiring less connections by hybrid bonding than known light sensors implemented in a stack of semiconductor layers.

An embodiment provides a light sensor comprising a plurality of pixels, wherein each pixels comprises:
  a first MOS transistor with a channel of a first type and a second MOS transistor with a channel of a second type, wherein the first and second transistors are series-connected and have their sources connected, with a gate of the second transistor configured to receive a comparative voltage;
  a first current source series-connected with the first and second transistors between a first node configured to receive a first supply voltage and a second node configured to receive a second supply voltage;
  a third MOS transistor and a second current source series-connected between a third node configured to receive a third supply voltage and a fourth node configured to receive a fourth supply voltage, wherein the third transistor has a gate connected to a fifth node of connection of the first current source with the first and second transistors in series and has a channel of the same type as the one of the first transistor;
  at least one photodiode that is coupled to a gate of the first transistor; and
  a reset switch with a conduction terminal connected to the gate of the first transistor.

According to an embodiment, another conduction terminal of the reset switch is connected to the connecting node of the second current source to the third transistor.

According to an embodiment, the sensor also comprises, for each third transistor, a shaping circuit with an input coupled to the connecting node of the second current source to the third transistor.

According to an embodiment:
  said at least one photodiode belongs to a semiconductor substrate; and
  the first, second, third transistors, the first and second current sources and the switch belong to a semiconductor layer lying on an insulating layer that lies on said semiconductor substrate.

According to an embodiment:
  a first interconnecting structure lies on the semiconductor layer;
  the shaping circuit belongs to another semiconductor layer or to another semiconductor substrate;
  a second interconnecting structure lies on said other semiconductor layer or said other semiconductor substrate; and
  a set comprising the substrate, the isolating layer, the semiconductor layer and the first interconnection structure is mounted on a set comprising the second interconnection structure and said other semiconductor layer or said other semiconductor substrate, by hybrid bonding of the first interconnection structure to the second interconnection structure.

According to an embodiment, the sensor additionally comprises a circuit configured to provide said comparative voltage.

According to an embodiment, the comparative voltage comprises voltage ramps.

According to an embodiment, the first and third supply voltages are equal and correspond to the ground.

According to an embodiment, the second and fourth supply voltages are positive relative to the ground, the first transistor has a P-type channel, the second transistor has a N-type channel, the first current source is connected to the second node and the second current source is connected to the third node.

According to an embodiment, in each pixel, a transfer gate that couples said at least one photodiode to the first transistor.

According to an embodiment, the first transistor is mounted as a source follower, the second transistor is mounted as a source follower and the third transistor is mounted as a common source.

According to an embodiment, the connection node of the second current source to the third MOS transistor is adapted to provide a signal indicating a result of a comparison of a voltage on the gate of the first transistor to the comparative voltage.

According to an embodiment, for at least two pixels of the sensor, a single second transistor, a single first current source, a single third transistor and a single second current source implement respectively the second transistors, the first current sources, the third transistors and the second current sources of said at least two pixels.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the known systems, applications and circuits comprising a light sensor have not been described, since the described embodiments and variants are compatible with these known systems, applications and circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless otherwise stated, below in the description, each voltage is in reference to the ground voltage. In addition, unless otherwise stated, the voltage of a node is equal to the voltage of this node in reference to the ground voltage.

Figure 1:
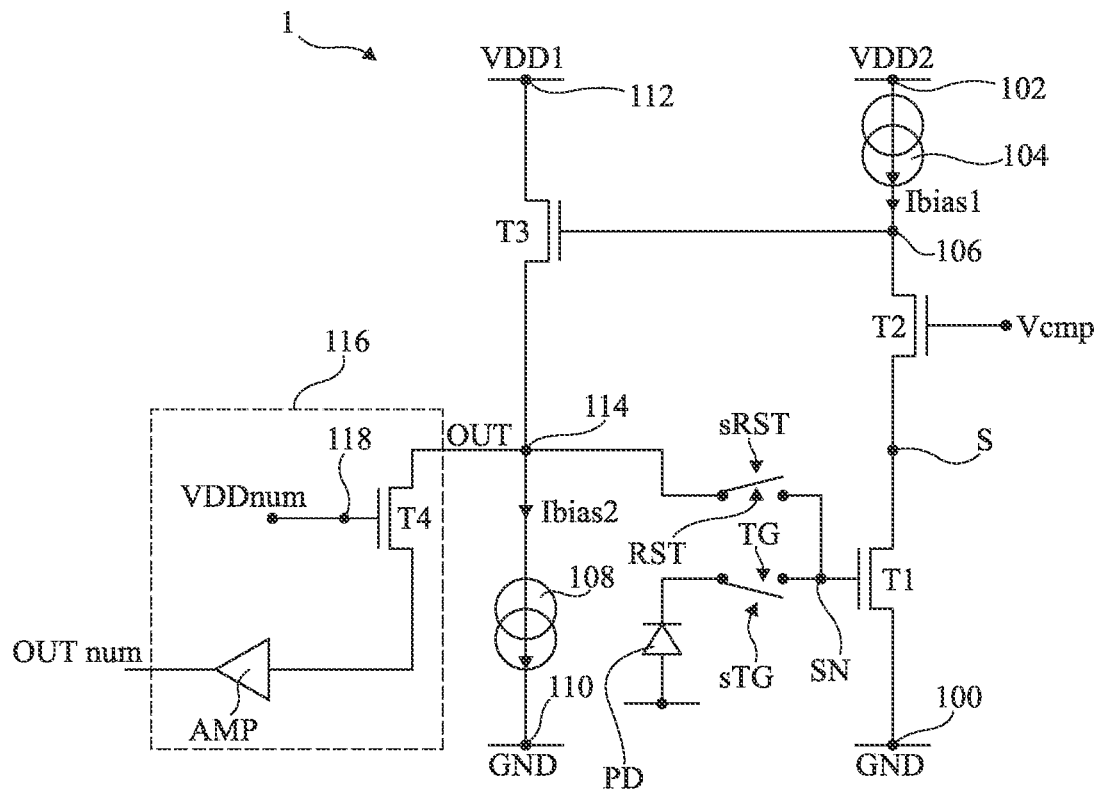
FIG. 1 represents an embodiment of a pixel of a light sensor.

The FIG. 1 represents an embodiment of a pixel 1 of a light sensor.

The pixel 1 comprises a MOS transistor ("Metal Oxide Semiconductor") T1 with a channel of a first type among N-type and P-type. In the example of FIG. 1, the transistor T1 has a P channel or, in other words, is a PMOS transistor. However, in other examples not illustrated, the transistor T1 has a N-type channel.

The transistor T1 is mounted as a source follower. The gate of the transistor T1 is coupled, preferably connected, to a sense node SN.

The pixel 1 comprises a MOS transistor T2 with a channel of a second type among N-type and P-type. In other words, the transistor T2 has a channel of the opposite type to the one of the channel of the transistor T1. In the example of FIG. 1, where the transistor T1 has a P-type channel, the transistor T2 has a N-type channel or, in other words, is a NMOS transistor.

The transistor T2 is mounted as a source follower. The gate of the transistor T2 is configured to receive a comparative voltage Vcmp. The voltage Vcmp is the voltage to which the voltage of the node SN is compared. Preferably, the voltage Vcmp is a voltage with an adjustable value. The gate of the transistor T2 receives, for example, voltage ramps Vcmp. As an example, the voltage Vcmp is provided by a voltage generating circuit of the light sensor comprising the pixel 1, wherein the sensor comprises several pixels 1 and, for example, this voltage Vcmp is provided simultaneously to all or a part of the pixels 1 of the sensor.

The two transistors T1 and T2 are series-connected with each other. More specifically, a first conduction terminal of the transistor T1, which means its source, is connected to a first conduction terminal of the transistor T2, which means the source of the transistor T2. In other words, the transistors T1 and T2 have their sources S connected to each other. The second conduction terminals of the transistors T1 and T2, which means their drains, are coupled to nodes 100 and 102. In other words, one of the transistors T1 and T2 has its drain coupled to the node 100, while the other of the transistors T1 and T2 has its drain coupled to the node 102. Hence, the two transistors T1 and T2 are series-connected between the nodes 100 and 102.

The node 100 is configured to receive a supply voltage, for example the ground GND in the FIG. 1. The node 102 is configured to receive another supply voltage VDD2. In the example of FIG. 1, where the transistor T1 has a P-type channel and the transistor T2 has a N-type channel, the voltage VDD2 of the node 102 is positive relative to the voltage GND of the node 100. In another non-illustrated example, where the transistor T1 has a N-type channel and the transistor T2 has a P-type channel, the voltage of the node 102 is lower than the one of node 100, for example is negative relative to the voltage GND of the node 100.

In addition, the pixel 1 comprises a current source 104. The current source 104 is series-connected with the transistors T1 and T2 between the nodes 100 and 102. In other words, the current source 104 has a conduction terminal connected to the serial association of the transistors T1 and T2 and, more specifically, to the drain of one of the transistors T1 and T2. Below in the description, the reference 106 is the connection node of the current source 104 to the association in series of the transistors T1 and T2.

In the example of FIG. 1, where the transistor T1 has a P-type channel and the transistor T2 has a N-type channel, the current source 104 is connected between the transistor T2 and the node 102, and the reference 106 is then the drain of the transistor T2. Thus, in the example of the FIG. 1, the drain of the transistor T2 is coupled to the node 102, the drain of the transistor T1 being coupled, preferably connected, to the node 100. In other words, in the example of the FIG. 1, the current source 104 has a conduction terminal coupled, for example connected, to the node 102, and another conduction terminal coupled, for example connected, to the transistor T2.

In another non-illustrated example, where the transistor T1 has a N-type channel and the transistor T2 has a P-type channel, the current source 104 couples the drain of the transistor T1 to the node 100, which means that it is connected between the node 100 and the transistor T1, wherein the reference 106 is the drain of the transistor T1 and the drain of the transistor T2 is coupled, for example connected, to the node 102.

The source 104 is configured, for example, to provide a constant current Ibias1.

The source 104 is implemented, for example, by a MOS transistor with a gate configured to receive a direct polarization voltage. In the example of FIG. 1, where the current source 104 couples the transistor T2 with a N-type channel to the node 102 that received a voltage higher than that of the node 100, the MOS transistor that implements the current source 104 has a P-type channel with a conduction terminal, for example its source, that is connected to the node 102 and a conduction terminal, for example its drain, that is connected to the node 106.

In the pixel 1, the transistors T1 et T2 are on when the voltage between the gates of the transistors T1 and T2 is higher than the sum of the threshold voltage of the transistor T1 and the threshold voltage of the transistor T2. When the transistors T1 and T2 are blocked, the terminal of the current source 104 connected to the node 106 has a voltage substantially equal to the voltage at the other terminal of the current source 104, i.e. the voltage VDD2 of the node 102 in the example of the FIG. 1. On the other hand, as soon as the difference between the voltage Vcmp and the voltage at the node SN is enough to have the transistors T1 and T2 turn on, the voltage at the terminal of current source 104 connected to the node 106 is driven toward or gets close to the voltage at the nodes 100 and 102 that is not connected to the current source 104, i.e. the voltage zero in the example of the FIG. 1.

Thus, the voltage at the node 106 is representative of the comparison between the voltage Vcmp and the voltage at the node SN.

The pixel 1 comprises at least one photodetector PD, for example only one photodetector PD in the example of FIG. 1. The node SN, which means the gate of the transistor T1, is coupled to the photodetector PD. In other non-illustrated examples, where the pixel 1 comprises several photodetectors PD, they are all coupled to the node SN.

In the example of FIG. 1, the photodetector PD is a pinned photodiode, which is then coupled to the node SN through a transfer gate TG that is represented as a switch in the FIG. 1. The gate TG is connected between the node SN and the photodiode PD. The transfer gate TG is controlled by a signal sTG, for example provided by a circuit of the sensor configured to control the pixels 1 of the sensor. In the FIG. 1, the pinned photodiode PD is shown connected between the gate TG and a node 108, for example grounded GND, although this node can receive other voltages than the ground.

In another non-illustrated example, the photodetector PD is a not pinned photodiode. In this other example, the transfer gate TG is preferably removed, and the photodiode PD is directly connected to the node SN.

In addition, the pixel 1 comprises a MOS transistor T3 and a current source 108 that are series-connected between a node 110 and a node 112. The node 110 is configured to receive a supply voltage, which means GND in the example of the FIG. 1, wherein the node 112 is configured to receive another supply voltage VDD1. In the example of the FIG. 1, the voltage VDD1, like the voltage VDD2, is higher than the voltage GND. In other words, the voltages of the respective nodes 112 and 102 have the same polarity as the voltages of the nodes 110 and 100 respectively. Preferably, the voltages of the nodes 110 and 100 are equal. The voltages of the nodes 112 and 102, for example, are equal, although, in other examples, the voltage VDD2 can be different from the voltage VDD1, preferably higher than the voltage VDD1.

The transistor T3 has its gate connected to the node 106. The transistor T3 is configured, for example, to provide the gain of the comparator of the pixel 1, wherein this comparator is implemented by the elements T1, T2, T3, 104 and 108.

The transistor T3 has a channel of the opposite type to the channel of the transistor T2, but of the same type to the channel of the transistor T1. Thus, in the example of the FIG. 1, the transistor T3 has a P-type channel. In another non-illustrated example, where the transistor T1 has a N-type channel, the transistor T2 has a P-type channel and the current source 104 couples the drain of the transistor T1 to the node 100, the transistor T3 has its gate connected to the connection node 106 of the transistor T1 to the current source 104 and has a N-type channel.

The transistor T3 is mounted as a common source. Thus, in the example of the FIG. 1, where the transistor T3 has a P-type channel, the transistor T3 has its source connected to the node 112, and the current source 108 couples the drain of the transistor T3 to the node 110, wherein the current source 108 has, for example, a terminal connected to the drain of the transistor T3 and a terminal connected to the node 110. In other examples where the transistor T3 has a N-type channel, the transistor T3 has its source connected to the node 100, and the current source 108 couples the drain of the transistor T3 to the node 112.

The current source 108 is configured to provide a constant direct polarization current Ibias2 of the transistor T3. The current source 108 is implemented, for example, by a MOS transistor with a gate configured to receive a polarization voltage and a drain coupled, preferably connected to the node 114. In the example of the FIG. 1, this MOS transistor has a N-type channel.

The connection node 114 of the transistor T3 to the current source 108 is adapted to provide a signal OUT giving the result of a comparison of a voltage on the gate of the first transistor to the comparative voltage.

According to an embodiment, the signal OUT is the output signal of the pixel 1.

According to another embodiment, for example illustrated by the FIG. 1, the pixel 1 additionally comprises a buffer circuit 116. The circuit 116 receives the signal OUT and provides a binary signal OUTnum at a first binary state if the voltage between the gates of the transistors T1 and T2 is higher than the sum of the threshold voltage of the transistor T1 and the threshold voltage of the transistor T2. Else, at a second binary state. In other words, the circuit 116 is a shaping circuit of the signal OUT.

Like the signal OUT, the signal OUTnum is representative of the result of a comparison of the voltage at the node SN with the voltage Vcmp.

The circuit 116 comprises, for example, a MOS transistor T4 and an amplifier AMP. The transistor T4 couples the node 114 to an input of the amplifier AMP. The gate of the transistor T4 is connected to a node 118 configured to receive a supply voltage VDDnum of the circuit 116, for example of the amplifier AMP. Thus, the transistor T4 makes it possible to adapt the maximum voltage of the signal OUT to the supply voltage of the amplifier. The voltage VDDnum, for example, is a supply voltage of the digital circuits of the sensor, for example of the digital circuits for the treatment of the output signals of the pixels 1 of the sensor. The output of the amplifier AMP provides the signal OUTnum. Of course, a person skilled in the art will be able to plan circuits 116 to shape the signal OUT other than the one described here in relation with the FIG. 1.

The pixel 1 also comprises a switch RST configured to initialize the voltage of the node SN. The reset switch RST is controlled by a signal sRST, for example provided by a circuit of the sensor configured to control the pixels 1 of the sensor. The switch RST has a terminal that is coupled, preferably connected, to the node SN. In the embodiment of FIG. 1, the other terminal of the switch RST is connected to the node 114.

In comparison to a pixel comprising a comparator implemented from a differential pair with an input connected to a sense node of the pixel, the pixel 1 is more compact, since its comparator comprises less MOS transistors than a comparator implemented from a differential pair. In addition, for the same power consumption, the gain of the comparator of the device 1 is higher than the gain of the same comparator implemented from a differential pair, which increases the accuracy of the comparison.

Figure 2:
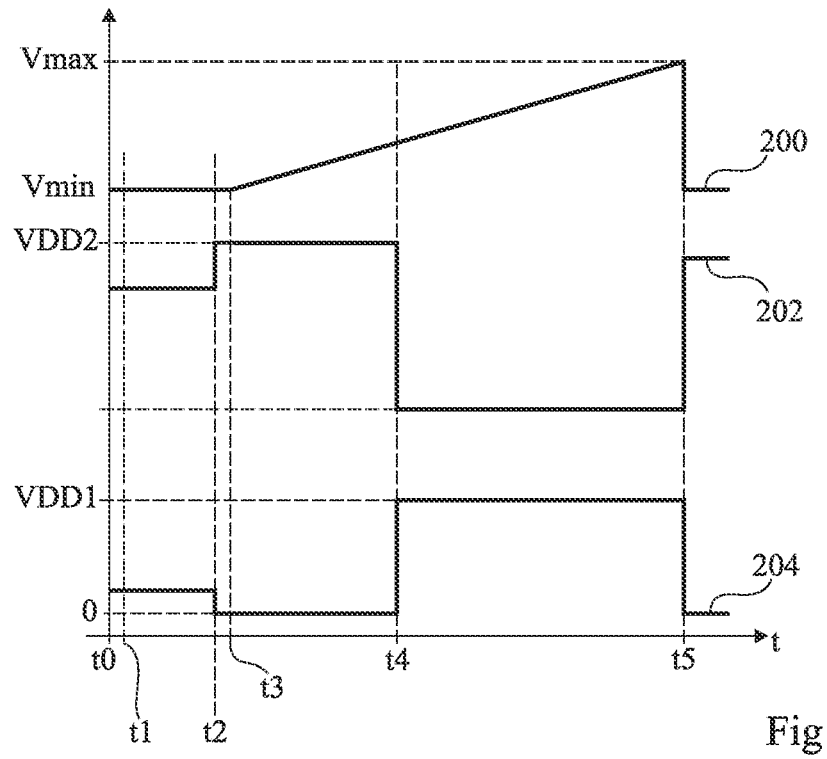
FIG. 2 illustrates with timing diagrams an example of operation of the pixel of FIG. 1.

The FIG. 2 illustrates with timing diagrams an example of operation of the pixel 1 of FIG. 1. More specifically, the FIG. 2 shows with timing diagrams 200, 202 and 204 the respective outlines of the voltage Vcmp, of the voltage of the node 106 and of the voltage OUT.

In the example of FIG. 2, the transistors T1 and T3 have a P-type channel, the transistor T2 has a N-type channel, the voltages VDD1 and VDD2 are positive relative to the voltage GND of the nodes 110 and 100, and the current source 104 couples the drain of the transistor T2 to the node 102. In addition, the gate of the transistor T2 receives, for example, voltage ramps Vcmp, for example rising ramps.

At a moment t0, the switch RST is closed and the voltage of the node SN is initialized at a value resulting from the voltage on the conduction terminal of the switch RST that is not connected to the node SN.

In this embodiment, the switch RST is connected between the node SN and the node 114. Thus, the voltage at the node SN is set at a value resulting from:
  the value of the voltage Vcmp at the gate of the transistor T2 when the switch RST is closed,
  the threshold voltage Vt1 of the transistor T1, and
  the threshold voltage Vt2 of the transistor T2.

This makes it possible to take into account dispersions in the comparator of the pixel 1, for example dispersions on the threshold voltages of the transistors T1, T2 and T3. In particular, for an equivalent power consumption and for an equivalent surface, the comparator of the pixel 1 shows less dispersion than a comparator implemented from a differential pair. In other words, in this embodiment, the switch RST rectifies an offset of the comparator of the pixel 1.

In the example here as illustrated in the FIG. 2, the photodiode PD of the pixel 1 is pinned and coupled to the node SN through the transfer gate TG (FIG. 1). At the moment t0, the transfer gate TG is on to drain these charges from the photodiode PD. In the illustrated example where the transistor T1 has a P-type channel, the photodiode PD is configured to store holes. That's why, at the moment t0, the gate of the transistor T2 receives a minimal value Vmin of the ramps Vcmp. Thus, at the moment t0, the voltage at the node SN is set at a value equal to Vmin−Vt1−Vt2.

In another non-illustrated example, where the transistor T1 has a N-type channel, the pinned photodiode PD is configured to store electrons, and the gate of the transistor T2 receives a voltage higher than the voltage Vmin, for example the maximum voltage Vmax of the ramps Vcmp.

More generally, a person skilled in the art will be able to adapt the value of the voltage received from the gate of the transistor T2 during a presetting stage of the node SN that comprises turning on the switch RST connected between the node SN and the node 114, for example to take into account the type of electrical charges that are stored in the photodiode PD during an integration stage.

After the moment t0, in this example where the photodiode PD is pinned, the transfer gate TG is turned blocked, for example at a moment t1 later than the moment t0, and an integration stage of the light by the photodiode PD starts.

The switch RST is turned to the blocked state between the moment t1 and a moment t2 later than the moment t1. At the moment t2, the transfer gate TG is turned on then blocked: turning off the gate TG to the blocked state is the end of the integration stage. When the gate TG is on, the charges generated by light and stored in the photodiode PD during the integration stage are transferred to the node SN, hence a change of the voltage of the node SN. In this example with a photodiode configured to store holes, the transfer of charges from the photodiode PD to the node SN induces an increase of the voltage of the node SN.

The increase of the voltage of the node SN at the moment t2 induces a decrease of the voltage between the gates of the transistors T1 and T2, which turn to the blocked state. This leads to a voltage of the node 106 more or less equal to VDD2 in this example, where the current source 104 is connected to the node 102. In addition, since the voltage of the node 106 more or less equal to VDD2, which is not lower than VDD1, the transistor T3 is blocked and the voltage of the node 114 is substantially zero in this example, where the current source 108 is connected to the node 110 that receives the ground GND.

At a moment t3 later than the moment t2, a reading stage of the pixel 1 starts. During this reading stage, the voltage of the node SN is compared to the voltage Vcmp. In this example, the moment t3 is the start of a voltage rising ramp Vcmp.

At a moment t4 later than the moment t3, the voltage Vcmp reaches a value such that the voltage between the gates of the transistors T1 and T2 is enough to have these transistors turn on or, in other words, to have the current Ibias1 flow through the transistors T1 and T2. Hence, the voltage of the node 106 is driven toward the voltage value of the node 100, to which the current source 104 is not connected, although the voltage of the node 106 cannot practically decrease lower than the sum of the voltage of the node SN and the threshold value of the transistor T1. This turns the transistor T3 on or, in other words, the current Ibias2 flows through the transistor T3, hence a voltage of the node 114 becomes substantially equal to the voltage VDD1.

At a moment t5 later than the moment t4, the ramp Vcmp reaches the value Vmax, then the voltage Vcmp turns to the value Vmin, which means the end of the reading stage of the pixel 1. Hence, the voltages of the nodes 106 and 114 restore the levels they had between the moments t2 and t3.

The duration of the high (or low) state of the signal OUT during the voltage ramp Vcmp, i.e. between the moment t3 and the moment t4, is representative of the value of the voltage at the node SN after the moment t2 of transfer of the charges from the photodiode PD to the node SN, hence of the amount of light that the photodiode PD received for the integration stage (from the moment t1 to the moment t2).

An advantage of the operation as described above, since the switch RST is connected to the node 114, is that there is no need to implement a correlated double sampling reading (CDS).

A person skilled in the art will be able to adapt the operation as above in case the transistor T1 has a N-type channel, the current source 104 is connected to the node 100 rather than 102, and the pinned photodiode PD is configured to store electrons.

Above is described an example where the comparative voltage Vcmp is a rising ramp during the reading stage of the pixel. A person skilled in the art is able to adapt this description in case of a falling ramp of Vcmp, for example by commutate the voltage Vcmp to the Vmax value at the moment t3 at the beginning of the reading stage: the ramp Vcmp will fall from the Vmax value at t3 down to the Vmin value at t4.

Furthermore, in some applications, it is advisable to identify quickly whether the amount of light that a pixel 1 receives during an integration stage is higher than a given threshold value or not. In this case, instead of a voltage ramp Vcmp during the reading stage, the voltage Vcmp shall have a constant value during the reading stage of the voltage of the node SN, which will depend on the threshold value above. Then, the status of the signal OUT during the reading stage directly specifies whether the amount of received light is higher than the threshold or not.

Above is described an example of operation for an embodiment where the switch RST is connected to the node 114 (FIG. 1). In another embodiment, the switch RST is connected between the node SN and a node configured to receive a reset voltage. This reset voltage is selected, for example, substantially equal to the value of voltage of the node 114 when the switch RST is connected to this node 114 and is on. In this case, to take these dispersions into account, it may be advisable to implement a correlated double sampling, for example by successively implementing:

reading the voltage of the node SN after resetting the node SN, wherein the reset of the node SN comprises turning the switch RST on;

transferring the charges from within the photodiode PD to the node SN, wherein the transfer comprises turning on the transfer gate TG while the switch RST remains blocked; and a second reading of the voltage of the node SN after said transfer.

In addition, in the example described in relation to the FIG. 2, the photodiode PD is pinned. A person skilled in the art will be able to adapt the description above to the case where the photodiode PD is not pinned, the switch RST is connected to a node other than 114, and the switch RST is configured to receive a reset voltage, for example by successively implementing:

a first reading of the node SN, comprising turning the switch RST on;

a reading of the voltage of the SN specifying the amount of light received by the pixel 1 since the first reset of the node SN;

a new reset of the node SN by turning the switch RST on and a reading of the voltage of the node SN while the switch RST is on.

The embodiments and variants of the pixel 1 described above in relation with the FIGS. 1 and 2 can be implemented different ways.

The whole pixel 1 can be implemented, for example, from a single semiconductor layer (or semiconductor tier), wherein the transistors T1, T2, T3, the current sources 104, 108, the at least one photodiodes PD, the switch RST, the gate TG (if there is one) and the circuit 116 (if there is one) of the pixel 1 are then all implemented from this single semiconductor layer.

As an alternative example, the at least one photodiode PD, the switch RST and the gate TG (if there is one) of the pixel 1 are implemented from one first semiconductor layer (or first semiconductor tier), wherein the other elements of the pixel 1 are implemented from a second semiconductor layer; the two semiconductor layers are then stacked and electrically coupled to one another.

More generally, the constitutive elements of pixel 1 can be implemented from several stacked semiconductor layers up one another and electrically coupled to one another.

In a sensor comprising several pixels 1, each pixel 1, for example, is implemented in a similar manner or, in other words, the allocation of the constitutive elements of each pixel 1 between several semiconductor tiers is identical to the one of the other pixels 1 of the sensor.

Figure 3:
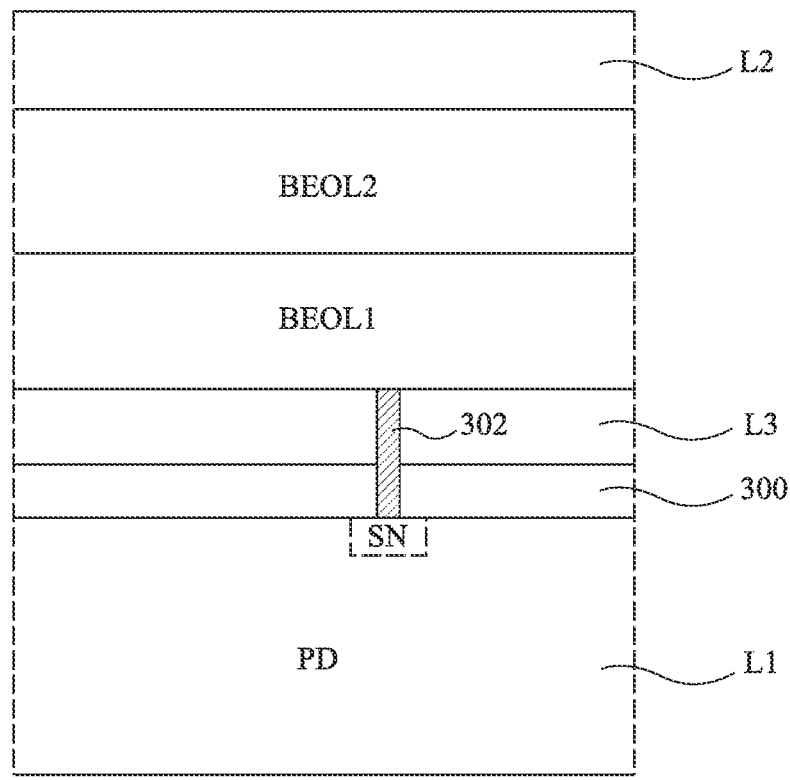
FIG. 3 illustrates with a schematic cross-section view a mode of operation of the pixel of FIG. 1.

The FIG. 3 illustrates with a schematic cross-section view a mode of operation of the pixel of FIG. 1. In this embodiment, the photodiode PD and the gate TG (if there is one) are implemented in a first semiconductor tier L1, the circuit 116 is implemented in a second semiconductor tier L2 and the other elements of the pixel 1 (transistor T1, T2, T3, current sources 104, 108 and switch RST) are implemented in a third semiconductor tier L3, wherein the tiers L1, L2 et L3 are piled up.

More specifically, the tier L1 is a semiconductor substrate, for example made of silicon.

The tier L3 is a semiconductor layer, for example made of silicon. The layer L3 lies on and is in contact with an isolating layer 300, while the layer L3 lies and is in contact with the substrate L1.

The isolating layer 300, for example, has been created, for example laid, onto the substrate L1 after formation of the isolating trenches, for example capacitive ones, that delimit the photodiode PD and after formation of the transfer gate TG. The semiconductor layer L3 has been created, for example, on the isolating layer 300, for example by epitaxy.

A back end of line interconnexion structure BEOL1 lies on and in contact with the layer L3.

The BEOL1 structure comprises, for example, isolating layers with embedded portions of conductor layers that are coupled with each other thanks to conducting vias. The BEOL1 structure is manufactured, for example, after formation, inside and on the layer L3, of the transistors T1, T2, T3 (not illustrated in the FIG. 3), of the current sources 104, 108 (not illustrated in the FIG. 3) and of the switch RST (not illustrated in the FIG. 3).

A conducting via 302, for example, passes through the isolating layer 300 and the semiconductor layer L3 to connect the node SN to the structure BEOL1. Although it is not illustrated in the FIG. 3, at least a part of the via 302 through the layer L3 is laterally covered with an isolating layer for electrical isolation from the layer L3.

The tier L2 is, for example, a semiconductor substrate or a semiconductor layer of the silicon on insulator type. The tier L2, for example, is made of silicon.

A back end of line interconnexion structure BEOL2 lies on and in contact with the layer L2. The BEOL2 structure comprises, for example, isolating layers with embedded portions of conductor layers that are coupled with each other thanks to conducting vias.

In order to electrically couple the levels L1 and L3 to the level L2, the set of the level L1, of the layer 300, of the level L2 and of the structure BEOL1, which constitute, for example, a first chip, is mounted by hybrid bonding on to the set of the level L2 and of the structure BEOL2, which constitute, for example, a second chip. This puts both structures BEOL1 and BEOL2 in contact with each other.

In an embodiment as pictures in the FIG. 3, for each pixel 1, only one electrical connection is required between the structures BEOL1 and BEOL2, which then corresponds to the node 114 of the pixel 1. This electrical connection is made, for example, by hybrid bonding of a conducting pad of the structure BEOL1 to a conducting pad of the structure BEOL2.

Figure 4:
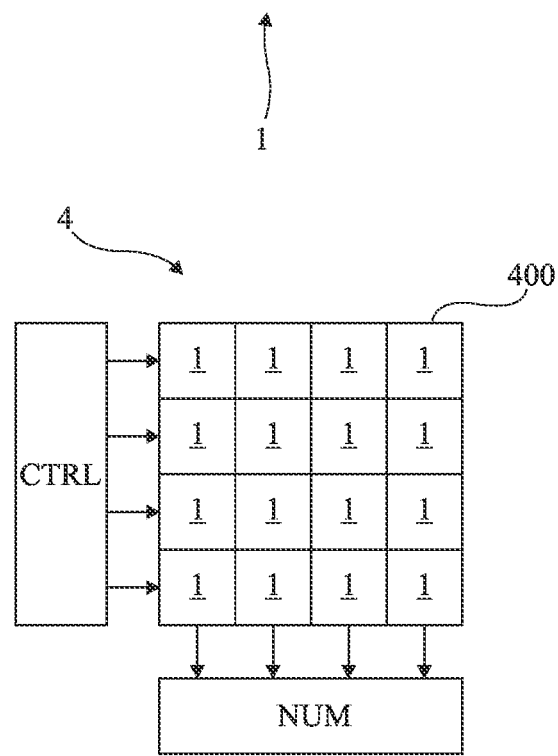
FIG. 4 illustrates schematically an example of a mode of operation of a sensor comprising a plurality of pixels of FIG. 1.

FIG. 4 illustrates schematically, as a block diagram, an embodiment of a sensor 4 comprising a plurality of pixels 1, for example designed as an array 400 comprising rows and columns of pixels 1. In the example of the FIG. 4, the array 400 comprises four rows and four columns of pixels 1, although the array 400 is able to contain more, for example more than a thousand columns and more, for example more than a thousand rows.

The sensor 4 comprises a control circuit CTRL configured to control pixels 1 of the sensor 4. The circuit CTRL provides, for example, identical signals to all pixels 1 of a same row, which means that all pixels 1 of a same row are controlled the same way. As an alternative example, the circuit CTRL provides identical signals to all pixels 1 of the array, which means that all pixels 1 of the array are controlled the same way.

The sensor 4 also comprises a treatment circuit NUM for the output signals of the pixels 1, for example of the signals OUTnum (FIG. 1) out of the pixels 1. When the circuit CTRL controls the reading of a row of pixels 1, for example, the signals out of all pixels 1 in this row are received in parallel by the circuit NUM, which makes the circuit NUM able, for example, to identify the column where the signal comes from for each of the signals received in parallel. As an alternative example, when the circuit CTRL controls the simultaneous reading of all pixels 1 of the array, the signals out of all pixels 1 in this row are received in parallel by the circuit NUM, which makes the circuit NUM able, for example, to detect, for each received out-signal, the pixels 1 that provided this out-signal, for example by implementing a detection by row/column.

A person skilled in the art shall be able to plan and implement light sensors comprising several pixels 1 different from the one of FIG. 4.

A person skilled in the art shall be able, for example, to plan light sensors comprising matrices of pixels 1 with event-driven architectures, where the signals out of the pixels are treated, for example, according to the moments where each of these signals switch. Such architectures are displayed, for example, in the documents "A 1280×720 Back-Illuminated Stacked Temporal Contrast Event-Based Vision Sensor with 4.86 µm Pixels, 1.066GEPS Readout, Programmable Event-Rate Controller and Compressive Data-Formatting Pipeline" by Thomas Finateu, Atsumi Niwa, Daniel Matolin, Koya Tsuchimoto, Andrea Mascheroni, Etienne Reynaud and Pooria Mostafalu; "A 1280×960 Dynamic Vision Sensor with a 4.95-µm Pixel Pitch and Motion Artifact Minimization" by Yunjae Suh, Seungnam Choi, Masamichi Ito, Jeongseok Kim, Youngho Lee, Jongseok Seo, Heejae Jung, Dong-Hee Yeo, Seol Namgung, Jongwoo Bong, Sehoon Yoo, Seung-Hun Shin, Doowon Kwon, Pilkyu Kang, Seokho Kim, Hoonjoo Na, Kihyun Hwang, Changwoo Shin, Jun-Seok Kim, Paul K. J. Park, Joonseok Kim, Hyunsurk Ryu and Yongin Park; and "Development of Event-based Sensor and Applications" by Shoushun Chen from the company Omnivision sensor solutions.

Furthermore, in the case of a light sensor comprising several pixels 1, instead of planning that each pixel 1 comprises a dedicated transistor T2, a dedicated transistor T3, a dedicated current source 104, a dedicated current source 108 and, if there is one, a dedicated circuit 116, it is possible to have all these elements T2, T3, 104, 108 and 116 in common among several pixels 1. In other words, for at least two pixels 1 of the sensor, the transistor T2, the transistor T3, the current source 104, the current source 108 and, if there is one, the circuit 116 of each of these at least two pixels are implemented respectively by a single transistor T2, a single transistor T3, a single current source 104, a single current source 108 and a single circuit 116. In other words, this single transistor T2, this single transistor T3, this single current source 104, this single current source 108 and this single circuit 116 are shared by these at least two pixels 1. The mutualization of at least some of these components of a pixel 1 between several pixels 1 of a sensor is available to a person skilled in the art.

Various embodiments and variants have been described. Those skilled in the art will understand that certain features of these embodiments can be combined and other variants will readily occur to those skilled in the art. In particular, although here are described examples of embodiments and variants thereof, where the voltages in the nodes 102 and 112 are positive relative to the voltages in the nodes 100 and 110, in other examples the voltages in the nodes 102 and 112 may be negative relative to the voltage of the nodes 100 and 110, for example by planning to invert the N and P types of the channel of each of the described transistors above.

Finally, the practical implementation of the embodiments and variants described herein is within the capabilities of those skilled in the art based on the functional description provided hereinabove.

What is claimed is:

1. Light sensor comprising a plurality of pixels, wherein each pixels comprises:
    a first MOS transistor having a channel of a first type and a second MOS transistor having a channel of a second type, wherein the first and second transistors are series-connected and have their sources directly connected to each other, with a gate of the second transistor configured to receive a comparative voltage;
    a first current source series-connected with the first and second transistors between a first node configured to receive a first supply voltage and a second node configured to receive a second supply voltage;
    a third MOS transistor and a second current source series-connected between a third node configured to receive a third supply voltage and a fourth node configured to receive a fourth supply voltage, wherein the third transistor has a gate connected to a fifth node of connection of the first current source with the first and second transistors in series, and wherein the third transistor has a channel of the first type;
    at least one photodiode that is coupled to a gate of the first transistor; and
    a reset switch with a conduction terminal connected to the gate of the first transistor.

2. Sensor according to claim 1, wherein another conduction terminal of the reset switch is connected to a connection node connecting the second current source to the third transistor.

3. Sensor according to claim 1, wherein the sensor also comprises, for each third transistor, a shaping circuit with an input coupled to a connection node connecting the second current source to the third transistor.

4. Sensor according to claim 1, wherein:
said at least one photodiode belongs to a semiconductor substrate; and
the first, second, third transistors, the first and second current sources and the reset switch belong to a semiconductor layer lying on an insulating layer that lies on said semiconductor substrate.

5. Sensor according to claim 4, wherein:
the sensor also comprises, for each third transistor, a shaping circuit with an input coupled to a connection node connecting the second current source to the third transistor;
a first interconnecting structure lies on the semiconductor layer;
the shaping circuit belongs to another semiconductor layer or to another semiconductor substrate;
a second interconnecting structure lies on said other semiconductor layer or said other semiconductor substrate; and
a set comprising the substrate, the isolating layer, the semiconductor layer and the first interconnection structure is mounted on a set comprising the second interconnection structure and said other semiconductor layer or said other semiconductor substrate, by hybrid bonding of the first interconnection structure to the second interconnection structure.

6. Sensor according to claim 1, wherein the sensor additionally comprises a circuit configured to provide said comparative voltage.

7. Sensor according to claim 6, wherein said comparative voltage comprises voltage ramps.

8. Sensor according to claim 1, wherein the first and third supply voltages are equal and correspond to the ground.

9. Sensor according to claim 8, wherein the second and fourth supply voltages are positive relative to the ground, the first transistor has a P-type channel, the second transistor has a N-type channel, the first current source is connected to the second node and the second current source is connected to the third node.

10. Sensor according to claim 1, comprising, in each pixel, a transfer gate that couples said at least one photodiode to the first transistor.

11. Sensor according to claim 1, wherein the first transistor is mounted as a source follower, the second transistor is mounted as a source follower and the third transistor is mounted as a common source.

12. Sensor according to claim 1, wherein a connection node connecting the second current source to the third MOS transistor is adapted to provide a signal indicating a result of a comparison of a voltage on the gate of the first transistor to the comparative voltage.

13. Sensor according to claim 1, wherein, for at least two pixels of the sensor, a single second transistor, a single first current source, a single third transistor and a single second current source implement respectively the second transistors, the first current sources, the third transistors and the second current sources of said at least two pixels.

14. Light sensor comprising a plurality of pixels, wherein each pixels comprises:
a first MOS transistor having a channel of a first type and a second MOS transistor having a channel of a second type, wherein the first and second transistors are series-connected and have their sources connected, with a gate of the second transistor configured to receive a comparative voltage;
a first current source series-connected with the first and second transistors between a first node configured to receive a first supply voltage and a second node configured to receive a second supply voltage;
a third MOS transistor and a second current source series-connected between a third node configured to receive a third supply voltage and a fourth node configured to receive a fourth supply voltage, wherein the third transistor has a gate connected to a fifth node of connection of the first current source with the first and second transistors in series, and wherein the third transistor has a channel of the first type;
at least one photodiode that is coupled to a gate of the first transistor; and
a reset switch with a conduction terminal connected to the gate of the first transistor,
wherein a connection node connecting the second current source to the third MOS transistor is adapted to provide a signal indicating a result of a comparison of a voltage on the gate of the first transistor to the comparative voltage.

* * * * *